United States Patent
Nakatsuka et al.

(10) Patent No.: US 7,738,521 B2
(45) Date of Patent: Jun. 15, 2010

(54) SEMICONDUCTOR LASER DEVICE

(75) Inventors: Shin'ichi Nakatsuka, Hino (JP); Tsukuru Ohtoshi, Hanno (JP); Kazunori Shinoda, Musashino (JP); Akihisa Terano, Hachioji (JP); Hitoshi Nakamura, Hachioji (JP); Shigehisa Tanaka, Koganei (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 11/606,186

(22) Filed: Nov. 30, 2006

(65) Prior Publication Data

US 2007/0121693 A1    May 31, 2007

(30) Foreign Application Priority Data

Nov. 30, 2005    (JP) ............................. 2005-345124

(51) Int. Cl.
    *H01S 3/04* (2006.01)
    *H01S 5/00* (2006.01)

(52) U.S. Cl. .................................. 372/43.01

(58) Field of Classification Search ............... 372/43.01
    See application file for complete search history.

(56) References Cited

U.S. PATENT DOCUMENTS

| 5,638,392 | A  | * | 6/1997 | Ramdani et al. ......... 372/45.01 |
| 5,665,977 | A  | * | 9/1997 | Ishibashi et al. ............... 257/17 |
| 6,741,623 | B2 | * | 5/2004 | Ishikawa et al. ......... 372/45.01 |
| 2002/0110945 | A1 | * | 8/2002 | Kuramata et al. ............. 438/36 |
| 2005/0139856 | A1 | * | 6/2005 | Hino et al. ................... 257/101 |

FOREIGN PATENT DOCUMENTS

JP    2003-179314    6/2003

OTHER PUBLICATIONS

19th IEEE International Semiconductor Conference, 63p.

* cited by examiner

*Primary Examiner*—Minsun Harvey
*Assistant Examiner*—Patrick Stafford
(74) *Attorney, Agent, or Firm*—Antonelli, Terry, Stout & Kraus, LLP.

(57) ABSTRACT

A super-lattice structure is used for a portion of a laser device of a self-aligned structure to lower the resistance of the device by utilizing the extension of electric current in the layer, paying attention to the fact that the lateral conduction of high density doping in the super-lattice structure is effective for decreasing the resistance of the laser, in order to lower the operation voltage and increase the power in nitride type wide gap semiconductor devices in which crystals with high carrier density are difficult to obtain and the device resistance is high.

10 Claims, 12 Drawing Sheets

SEMICONDUCTOR LASER DEVICE

CLAIM OF PRIORITY

The present application claims priority from Japanese application JP 2005-345124 filed on Nov. 30, 2005, the content of which is hereby incorporated by reference into this application.

BACKGROUND OF THE INVENTION

1. Field of the Invention

The present invention relates to a semiconductor laser optical source used as an optical source for laser beam printers or optical disk devices, and more particularly to a short wavelength semiconductor laser device formed with a semiconductor of a forbidden band width of 2 eV or more.

2. Description of the Related Art

Conventional short wavelength semiconductor laser devices have been formed of semiconductor materials of GaN and AlGN or the like with wide forbidden band width of more than 2 eV. For the materials of such wide forbidden band width, it has been known that either one of p-type doping or n-type doping is extremely difficult to attain a semiconductor device using the pn junction. Also, for the semiconductor material such as GaN or AlGaN, it has long been considered to realize a semiconductor laser device since p type impurity doping is particularly difficult.

Figure 17:
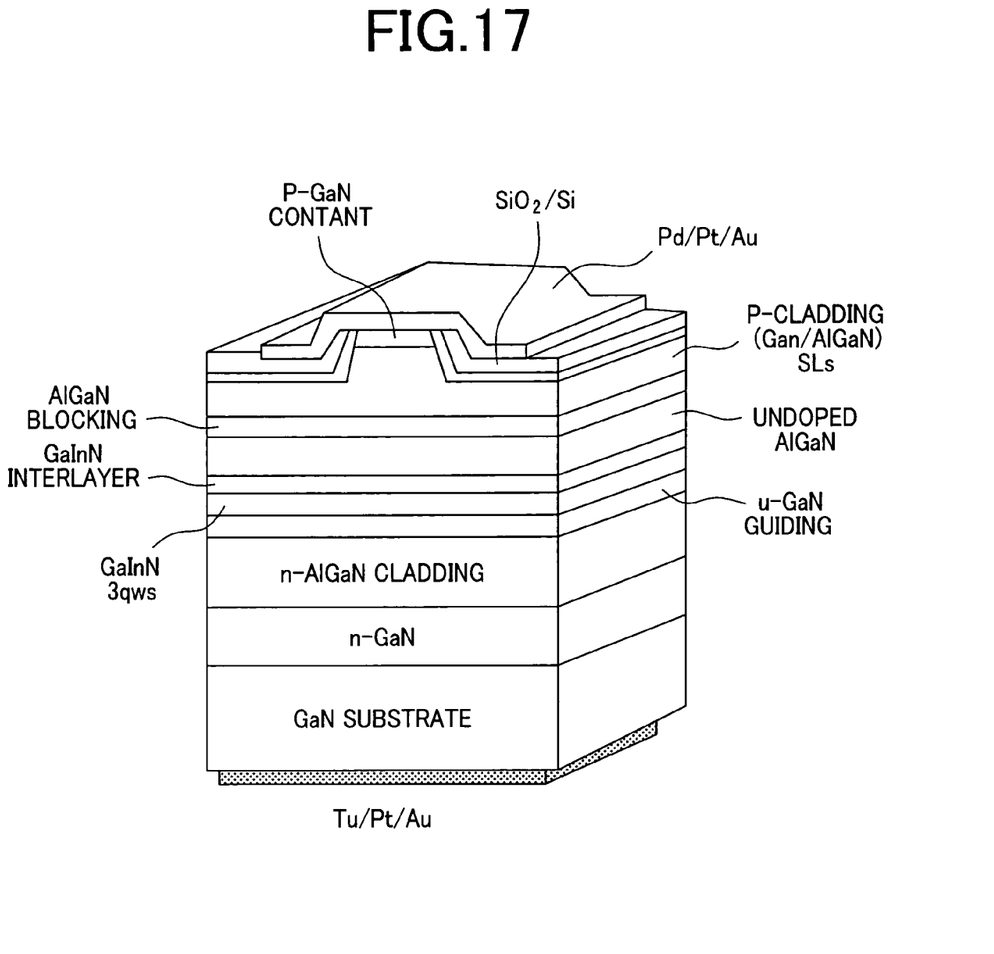
FIG. 17 is a perspective view showing an example of an conventional ridge type semiconductor laser.

With the progress in crystal growth techniques in recent years, p type doping has become possible even for the semiconductor materials described above, and semiconductor lasers have been developed for practical use. The p type doping, however, is not still easy for the type of the materials described above. For this case, there has been known, for example, that a stacked structure as shown in FIG. 17 for obtaining p type impurity density necessary for practical semiconductor laser devices. To obtain the p type impurity, a p-cladding layer is formed as a super lattice structure of GaN having a relatively narrow forbidden band width and $Al_{0.16}Ga_{0.84}N$ having a relatively wide forbidden band width, and the energy of p type impurity doped to the $Al_{0.16}Ga_{0.84}N$ layer is at a level lower than the Fermi level for the entire super lattice. However, in the ridge waveguide semiconductor laser device, since a current path is only a path in which a current vertically flows in the ridge having a rectangular cross section, the device resistance could not be reduced significantly even with considerations.

One example of the semiconductor laser structures manufactured by using the technique described above includes the document of T. Mizuno, et al. (19th IEEE International Semiconductor Conference 63p).

On the contrary, as a current confinement structure of a semiconductor laser device, a structure referred to as a self-aligned structure is known, which attains the current confinement and the optical waveguide simultaneously with a groove formed in a current blocking layer as described above. Also, for nitride type semiconductor laser device, a structure shown in FIG. 18 has been disclosed (JP-A No. 2003-179314) by Nakajima, et al, for example. In the figure, reference numeral 1 denotes a semiconductor substrate; 7, n-cladding layer; 8, an active layer; 9, a p-cladding layer; 4, a current blocking layer; and 1, a single composition n-cladding layer (re-growth cladding layer). In this structure, the narrowest portion in the current blocking layer 4 is positioned several hundreds nm away from the activate layer 8 to provide a current distribution depicted by solid lines with reference numeral 12, over which current flows.

SUMMARY OF THE INVENTION

As has been described above, short wavelength laser devices for practical use have been being developed with the progress in crystal growth techniques and the application of the superlattice structure. Despite the progress, the serial resistance of the device is still as high as about 20Ω. It is sufficient, however, for read only optical recording devices used with power of several mW and rewritable optical recording devices of relatively low speed used with power of about 100 mW. However, it is insufficient for high-speed rewritable optical recording devices that require large optical power and large driving currents.

As a result of using a superlattice structure with an aim of improving the doping level in the p-cladding layer, the doping level has been improved about from 2 to $3\times10^{17}$ $cm^{-3}$ to $1\times10^{18}$ $cm^{-3}$ or more. However, the device resistance is still at an insufficient level is and this is considered to be attributable to the fact that the electric resistance generated in the direction (vertical direction) perpendicular to the film surface of the super lattice is several times as high as the electric resistance generated in the direction (lateral direction) horizontal to the film surface of the superlattice. Further, the high density doping layer formed by the above method has an intense light absorption to laser light for the high density doping, resulting in a problem of increasing resonator losses of the semiconductor laser device.

To compensate an conduction obstruct in the vertical direction due to the superlattice structure described above and sufficiently use the effect of high density doping obtained by the super lattice structure, the present invention provides a semiconductor laser device having at least cladding layers and an active layer formed above a single crystal substrate, the cladding layers being made of first and second conduction type semiconductor crystals, and the active layer being made of semiconductor crystals with a forbidden band width narrower than that of the cladding layer. The semiconductor laser device further comprises a current blocking layer provided with a groove-like current conduction region on the cladding layer of the second conduction type and made of a first conduction type or semi-insulating semiconductor layer, the groove like current conduction region being positioned on the side opposite to the single crystal substrate with the active layer used as a reference position. In addition, the semiconductor laser device further comprises a structure for burying the current blocking layer with a re-growth cladding layer made of the second conduction type semiconductor. In the semiconductor laser device, at least a portion of the re-growth cladding layer is formed as a super lattice cladding layer formed by alternately stacking semiconductor layers of a wide forbidden band width and semiconductor layers of a narrow forbidden band width at a period of 4 nm or more and 10 nm or less. That is, even when there is a limit to improve the electrical conductivity in the vertical direction by the super lattice structure, the device resistance can be decreased remarkably by the extension of a current due to a wide range of the lateral conduction, as shown with the current distribution depicted by bold broken lines in FIG. 18.

According to the present invention, it is possible to realize significant reduction of the serial resistance of semiconductor laser device using a GaN type material, although it has been difficult to realize a semiconductor laser with a low resistance due to the difficulty of p type doping. In addition, the invention realizes a blue color semiconductor laser device capable of being driven by using a standard 5 V power source.

DESCRIPTION OF THE REFERRED EMBODIMENTS

Figure 1:
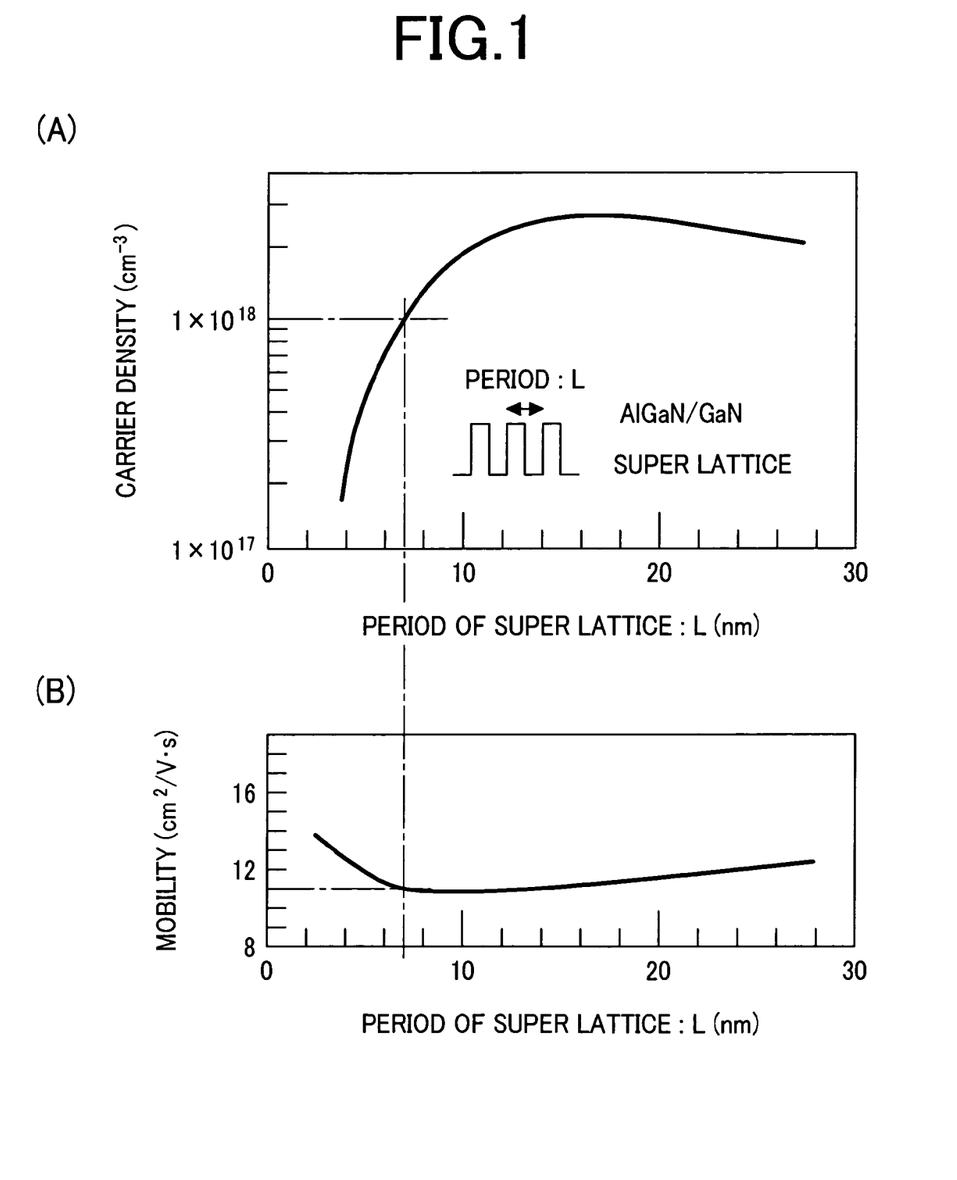
FIG. 1(A) is a graph showing an example of the relationship between the period of an AlGaN/GaN super lattice and a carrier density.
FIG. 1(B) is a graph showing the relationship between the period of super lattice and mobility.

As described above, in an AlGaN/GaN superlattice structure, activation rate of acceptor impurities in an $Al_{0.16}Ga_{0.84}N$ barrier layer where the energy level is lower than the Fermi level is increased and a higher carrier density can be attained compared with that of the uniform composition AlGaN. Holes emitted from the acceptor impurities are accumulated in the GaN well layer. When the holes travel in the direction in parallel to the surface of the super lattice (horizontal direction), they are activated in the barrier layer with avoiding scattering of charged impurities. This does not decrease the mobility of carriers due to an increase in the doping density that is a problem in the uniform composition nitride semiconductor. Thus, the conductivity in the lateral direction about 3 to 5 times as high as that in the single composition semiconductor layer can be attained. FIG. 1(A) shows the characteristics of the relationship between the period of the superlattice and the carrier density, which have been reported. FIG. 1(B) shows the characteristics of the relationship between the period of the superlattice and the mobility, which have been reported.

As can be seen from FIGS. 1(A) and 1(B), the carrier density starts to increase at a period of about 4 nm of the super lattice, and the effect of the increase is clearly noticeable at a period of about 6 nm. In the crystals of a uniform composition, while the mobility decreases along with increase in the carrier density and acts in the direction of offsetting the effect of increasing the carrier density in view of the electrical conductivity, a mobility of only $10\,cm^2/V \cdot s$ is attained even at the carrier density of $1 \times 10^{18}$ level in such a super lattice structure.

Figure 2:
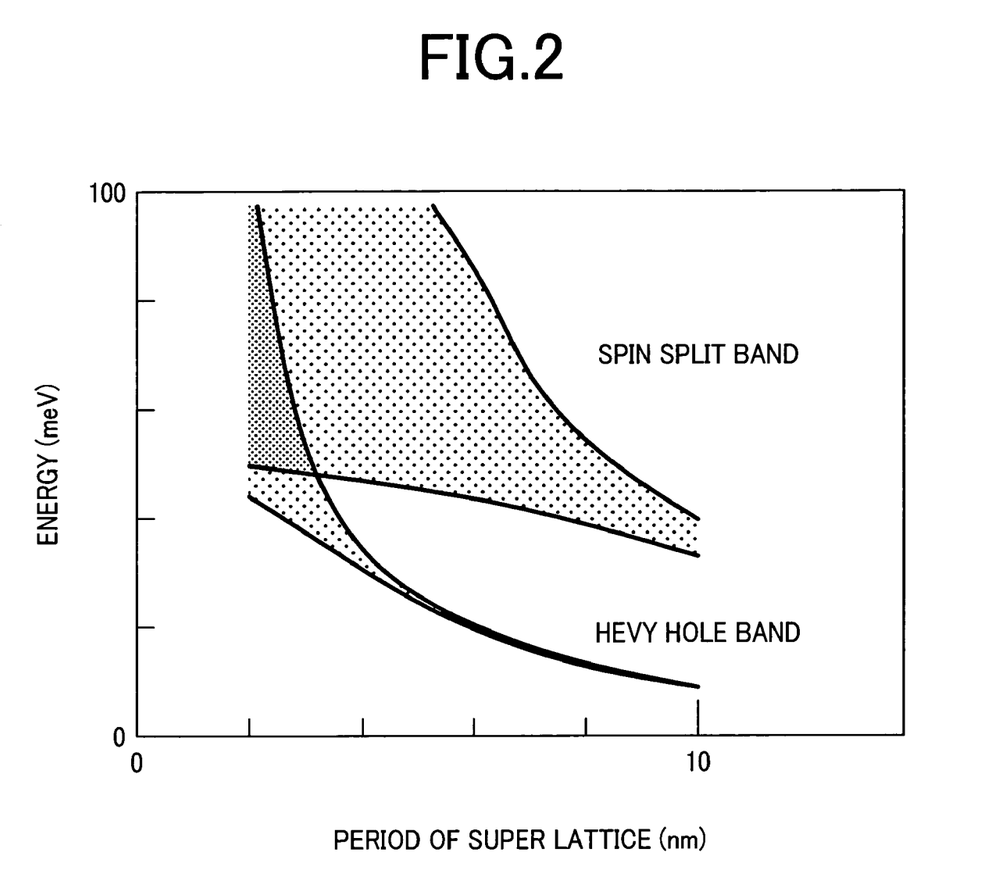
FIG. 2 is a graph showing an example of calculation results for the energy of a mini-band formed of a super lattice layer.

On the other hand, it is necessary to inject a current in the vertical direction into a double hetero structure in the semiconductor laser device, and the vertical components are generally important as the direction of electric conduction. When the energy for the mini-band formed of the super lattice layer is calculated, a result as shown in FIG. 2 is obtained. A meshed region in FIG. 2 is a level that accepts the presence of holes. It is considered that electrical conduction through the super lattice occurs substantially in proportion to the width of the mini-band. In the calculation for the mini-band in FIG. 2, at the period of 4 nm or more which has a meaningful effect to the doping, the mini-band width enabling vertical electrical conduction is obtained mainly in the spin split off band. Thus, an approximate electrical conductivity in the vertical direction can be estimated while considering the energy difference from the base level and the band width.

Figure 3:
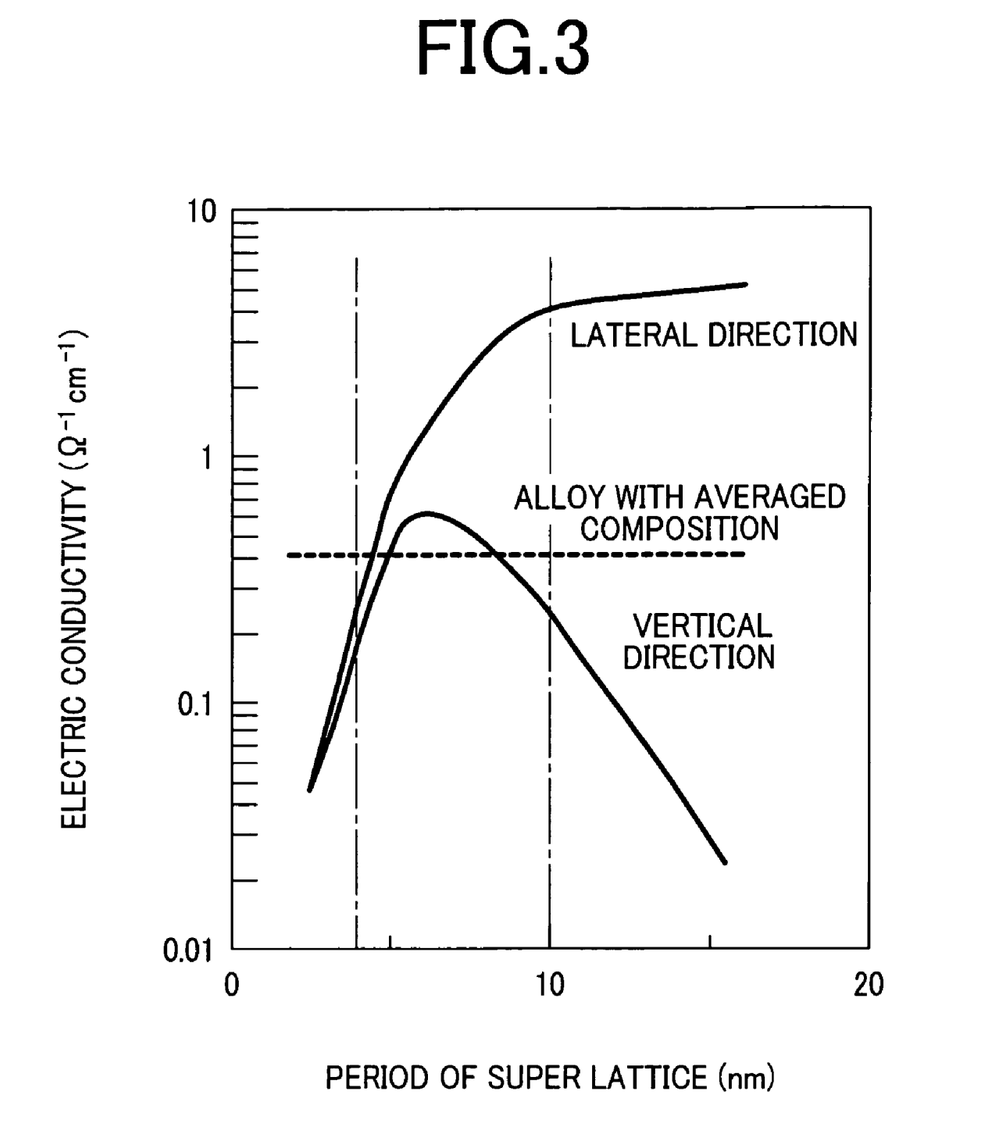
FIG. 3 is a graph showing an example of the relationship between the electrical conductivity in the lateral direction and that in the vertical direction of a super lattice layer and an alloy with averaged composition, and the period of super lattice.

FIG. 3 is a view showing a relation between the electrical conductivity of the super lattice layer and the alloy with averaged composition in the lateral direction and the vertical direction estimated as described above and the period of the super lattice. In FIG. 3, it is considered that the period of the super lattice needs to be 4 nm or more and 10 nm or less in the case of $Al_{0.16}Ga_{0.84}N/GaN$ in order to obtain an electrical conductivity in the vertical direction equivalent to or higher than that of AlGaN of a single composition. It can be seen that the optimal period of the super lattice is desirably in a range from 5 nm to 7 nm in consideration of 70% or more of the maximum value of the intended electrical conductivity in the vertical direction as a reference value. In this case, it is possible to obtain the electrical conductivity in the lateral direction, which is 3 to 5 times as high as that of the AlGaN alloy of the single composition.

Figure 4:
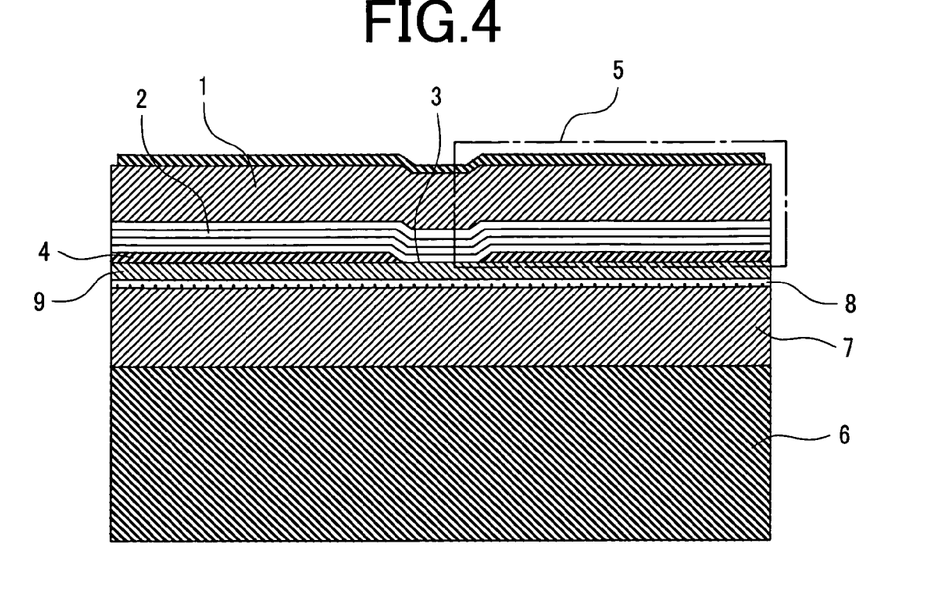
FIG. 4 is a cross sectional view showing a model for the calculation of device resistance of a semiconductor laser device in which super lattice lateral conduction layer is formed between a re-growth cladding layer and a current blocking layer having a groove-like current conduction region.
Figure 18:
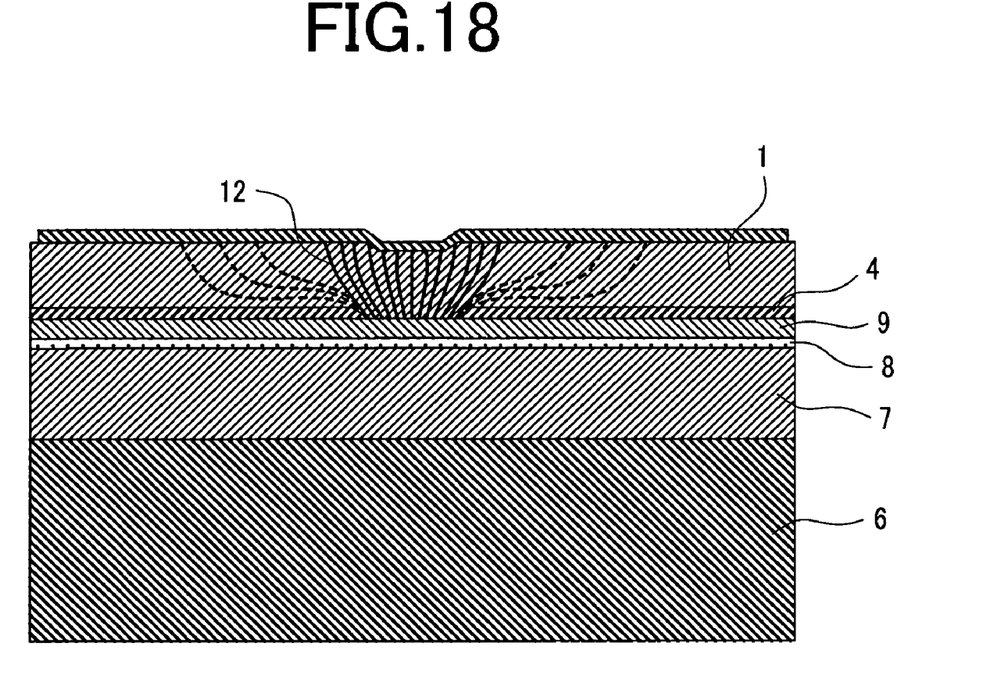
FIG. 18 is a cross sectional view for explaining the effect of a current blocking layer of a self alignment semiconductor device.

To estimate the effect of decreasing the operation current in the structure as described above, calculation was conducted with a model shown in FIG. 4. In the model, a super lattice lateral conduction layer 2 is formed between a single composition cladding layer 1 and a current blocking layer 4. The single composition cladding layer 1 is formed on a semiconductor laser device with a laminated structure having a semiconductor substrate 6, n type cladding layer 7, active layer 8, p type cladding layer 9, and current blocking layer 4 formed therein, as shown in FIG. 18. The current blocking layer 4 has a groove-like current conduction region 3.

Figure 5:
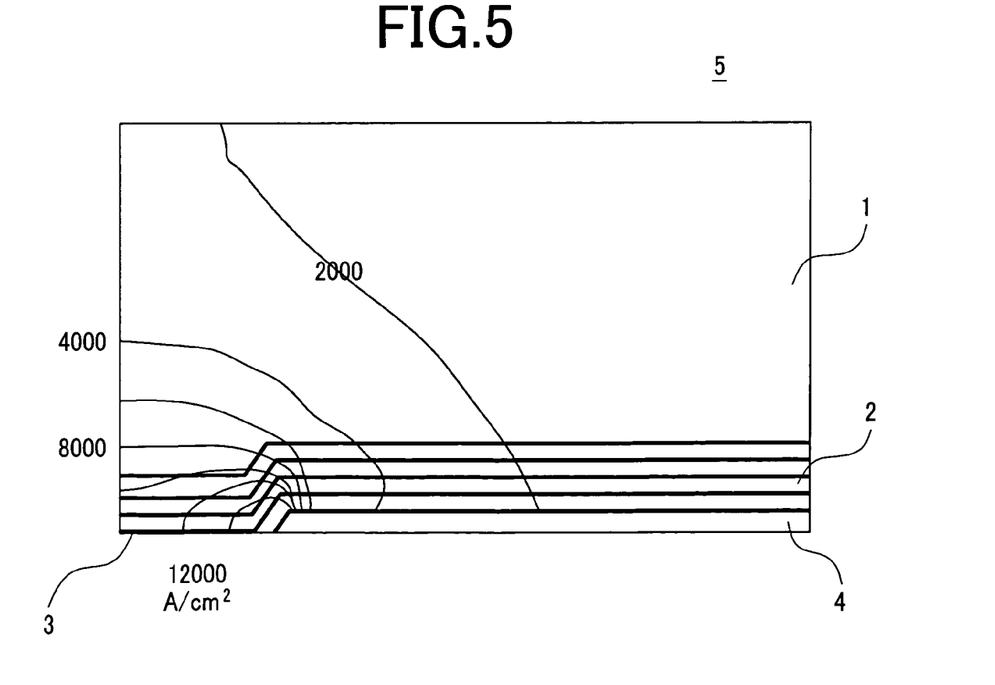
FIG. 5 is a graph showing results of calculation for the distribution of current density in the case where the super lattice lateral conduction layer of FIG. 4 has a similar resistivity to that of a single composition alloy.
Figure 6:
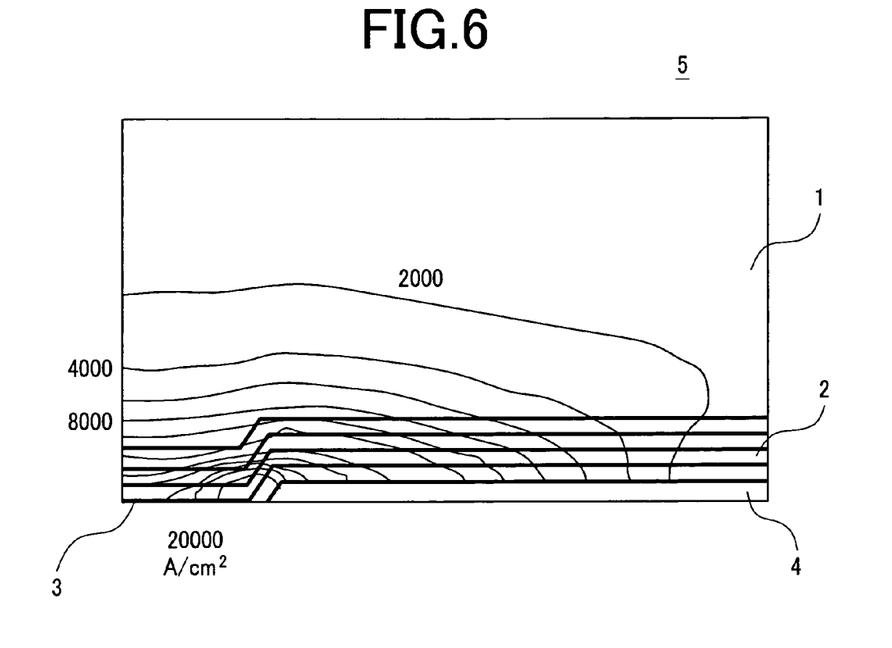
FIG. 6 is a graph showing results of calculation for the distribution of current density in the case where the super lattice lateral conduction layer of FIG. 4 has 5:1 anisotropic resistivity for vertical and lateral directions.

FIG. 5 and FIG. 6 show the results showing the current density distribution in the calculated region 5 shown in FIG. 4 when a voltage at 1 V is applied between the surface and the groove portion. FIG. 5 shows the case where the electrical conductivity of the super lattice lateral conduction layer 2 shows isotropic values to the electrical conductivity of the cladding layer 11 of single composition, while FIG. 6 shows the case where the electrical conductivity in the vertical direction is same as that of the single composition cladding layer 1 and the electrical conductivity in the lateral direction is five times as high as the single composition cladding layer 1. The entire thickness of the p-cladding layer 9 is 1 μm. The thickness of 0.2 μm that is first obtained in the re-growth cladding layer 11 is formed of a super lattice layer 2 in the structure having the AlGaN/GaN super lattice. As a result of the calculation, in the laser device of the self aligned structure in the case of isotropic electrical conductivity (FIG. 5), since the average current density for the stripe portion is 12,000 A/cm$^2$ relative to the voltage of 1 V in the case of the stripe width of 1.4 μm and the resonator length (current conduction region 3) of 600 μm, the total of the current flowing to the stripe is about 100 mA and the serial resistance is about 10Ω. On the other hand, in the laser device of the self aligned structure in the case where the lateral electrical conductivity is 5 times as high as the single composition cladding layer 11 (FIG. 6), the average current density of the stripe portion is 20,000 A/cm$^2$. That is, since the total of the current flowing to the stripe is about 166 mA by increasing the electrical conductivity of the super lattice lateral conduction layer 2 to five times, it can be seen that 6Ω serial resistance can be attained by the lateral electrical conductivity in the case where the stripe width and the cavity length are five times as large as the alloy of single composition.

Embodiment 1

A first embodiment of the present invention based on the results of the study as described above is to be described with reference to the drawings. At first, the structure of the semiconductor laser chip of Embodiment 1 is to be described based on the manufacturing steps with reference to FIGS. 7 to 9.

Figure 7:
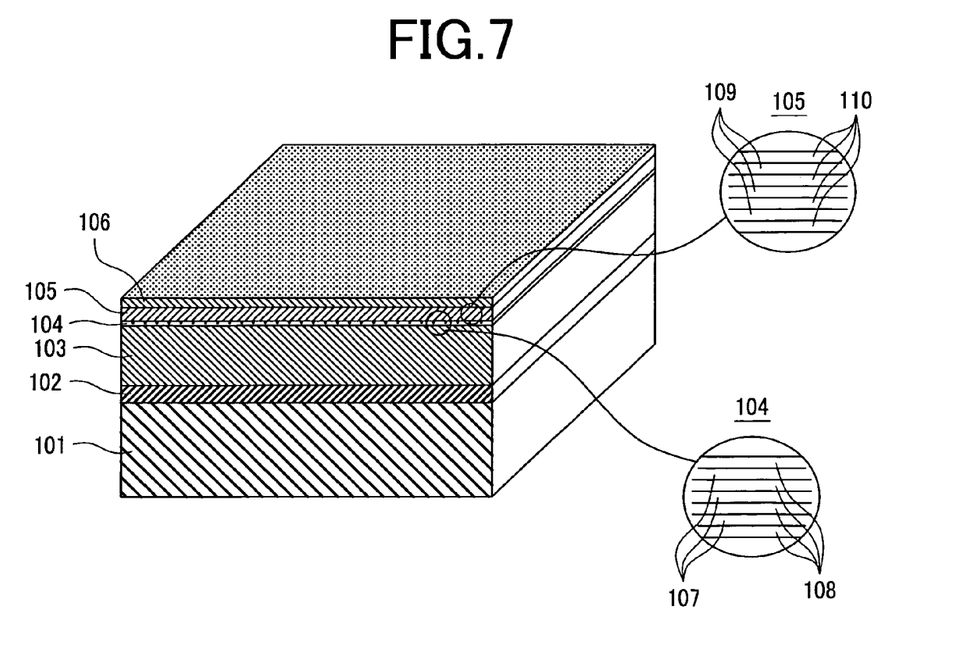
FIG. 7 is a perspective view showing the structure after growing a current blocking layer in a semiconductor laser chip of Embodiment 1.
Figure 8:
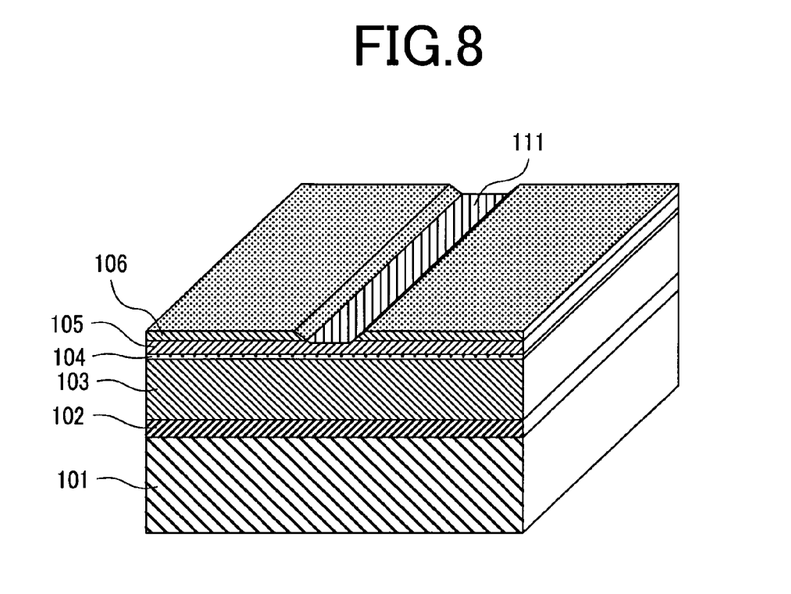
FIG. 8 is a perspective view showing the structure in the state of forming a groove-like conduction region in a current blocking layer of a semiconductor region chip of Embodiment 1.
Figure 9:
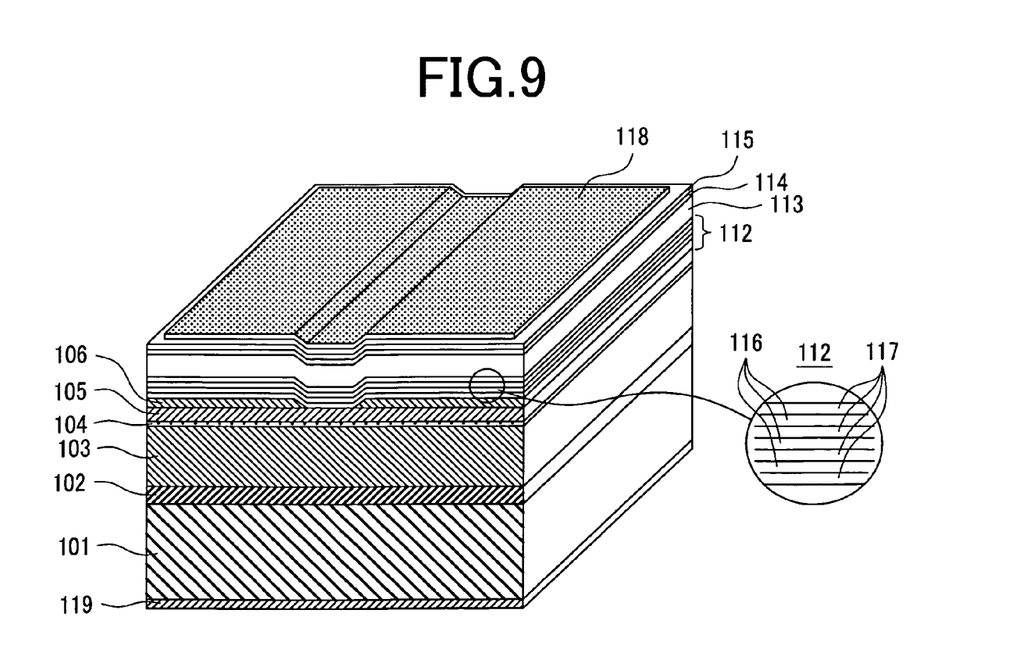
FIG. 9 is a perspective view showing the structure of a completed semiconductor laser chip of Embodiment 1.

In FIG. 7 to FIG. 9, reference numeral 101 denotes an n-GaN substrate, and the plane orientation of the n-GaN substrate 101 is (1-100) plane. Above the n-GaN substrate 101, an n-GaN buffer layer 102 (0.2 μm), an n-Al$_{0.08}$Ga$_{0.92}$N cladding layer 103 (Si doped, n=1×10$^{18}$ cm$^{-3}$, 1.2 μm), a GaInN/GaN multi-quantum well active layer 104, a p-GaN/AlGaN super lattice layer 105 (Mg-doped, p=7×10$^{17}$ cm$^{-3}$, 0.15 μm), and n-Al$_{0.16}$Ga$_{0.84}$N current blocking layer 106 (Si doped, p=1×10$^{19}$ cm$^{-3}$, 0.1 μm) are subjected to successive crystal growth using a metal organic chemical vapor deposition method to form a structure shown in FIG. 7. The GaInN/GaN multi-quantum well active layer 104 comprises, as shown in an enlarged scale on the right of the FIG. 7, 4 layers of Ga$_{0.8}$In$_{0.2}$N well layers; 107 (7 nm thickness) and 5 layers of GaN barrier layers 108 (4 nm thickness) sandwiching each of the layers described above. Further, the P-GaN/AlGaN super lattice structure 105 has a structure in which Mg-doped Al$_{0.16}$Ga$_{0.84}$N layers 109 (3 nm) and Mg-doped GaN layers 110 (3 nm) are alternately laminated, as shown in an enlarged scale on the right of the figure.

On the n-Al$_{0.16}$Ga$_{0.84}$N current blocking layer 106, a silicon oxide film is formed and a stripe-like groove is formed by using photolithography. Using the silicon oxide film as a mask, portions of the n-Al$_{0.16}$Ga$_{0.84}$N current blocking layer 106 and the p-GaN/AlGaN super lattice layer 105 are removed by a reactive ion etching method to form a stripe-like groove 111, resulting in obtaining the structure shown in FIG. 8.

Then, crystal growth is again applied to the wafer using the metal organic chemical vapor deposition technique. An AlGaN/GaN super lattice lateral conduction layer 112(Mg-doped, p=10$^{18}$ cm$^{-3}$, 0.2 μm), a p-Al$_{0.08}$Ga$_{0.92}$N second cladding layer 113 (Mg-doped, p=2×10$^{17}$ cm$^{-3}$, 0.5 μm), a GaN cap layer 114 (Mg-doped, p=3×10$^{17}$ cm$^{-3}$, 0.1 μm) and a GaInN super lattice contact layer 115 (Mg-doped, p=2×10$^{19}$ cm$^{-3}$, 5 nm) are subjected to successive crystal growth to form a structure shown in FIG. 9. The AlGaN/GaN super lattice lateral conduction layer 112 has Mg-doped A$_{0.16}$Ga$_{0.84}$N layers 116 (3.5 nm) and Mg-doped GaN layers 117 (3.5 nm) alternately laminated, as shown in an enlarged scale on the right of the figure.

On the GaInN super lattice contact layer 115 at the wafer surface of this structure, a TiAu layer 118 is evaporated as a p-electrode. On the other hand, an NiAlAu layer 119 is evaporated to the rear side of the GaN substrate 101 as an n-electrode. Then, it is cleaved to a resonator length of 600 μm into a laser chip. While the p-second cladding layer 113 can also be formed entirely as the AlGaN/GaN super lattice lateral conduction layer 112, it shows a sufficient effect at 0.2 μm. On the other hand, in the case where the super lattice layer is excessively thick, the surface of crystals tends to deteriorate. Thus, only a portion of the re-growth cladding layer 113 is formed as the super lattice structure.

The thus manufactured semiconductor laser device performs laser oscillation at a threshold current of about 40 mA and the serial resistance is about 6Ω. The slope efficiency of the optical power of the device is about 1.2 mW/mA, and the driving current is about 290 mA at 300 mW of the optical power. The current/voltage characteristics of the device show that a current linearly increases in the vicinity of 3 V. Thus, the operation voltage in this case is 4.74 V and the device can be driven by a general power source of 5 V with a margin. Further, the operation voltage in the case of using the semiconductor laser device with power of about 100 mW is about 3.6 V and can be mounted also in a portable recording device driven by three dry cell batteries.

Embodiment 2

A second embodiment of the invention is to be described with reference to the drawings. At first, the structure of the semiconductor laser chip of Embodiment 2 is to be described based on the manufacturing steps with reference to FIGS. 10 and 11.

Figure 10:
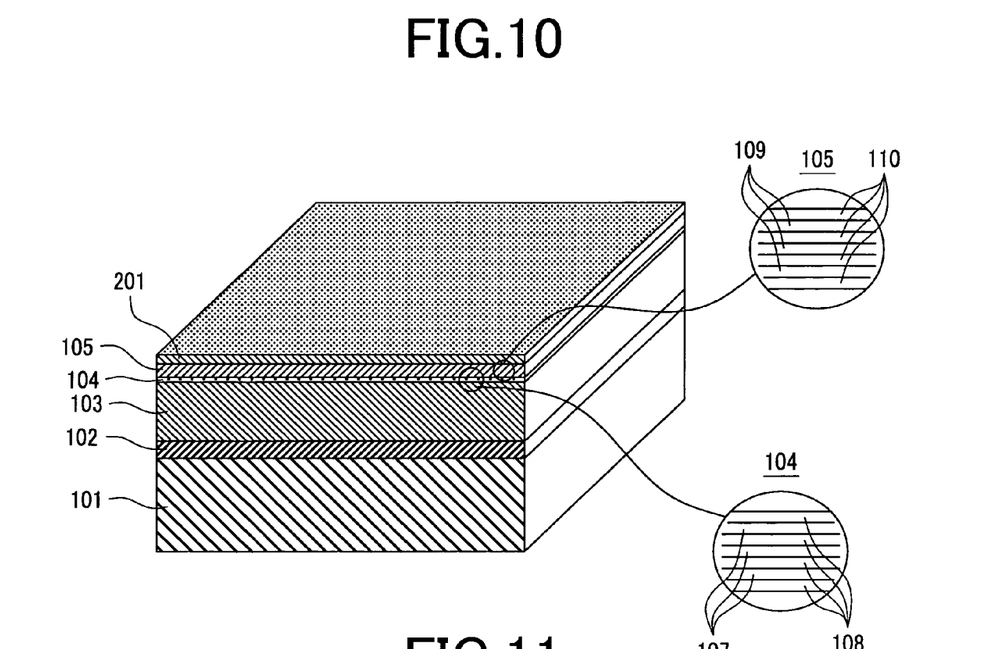
FIG. 10 is a perspective view showing the structure after growing a current blocking layer in a semiconductor laser chip of Embodiment 2.
Figure 11:
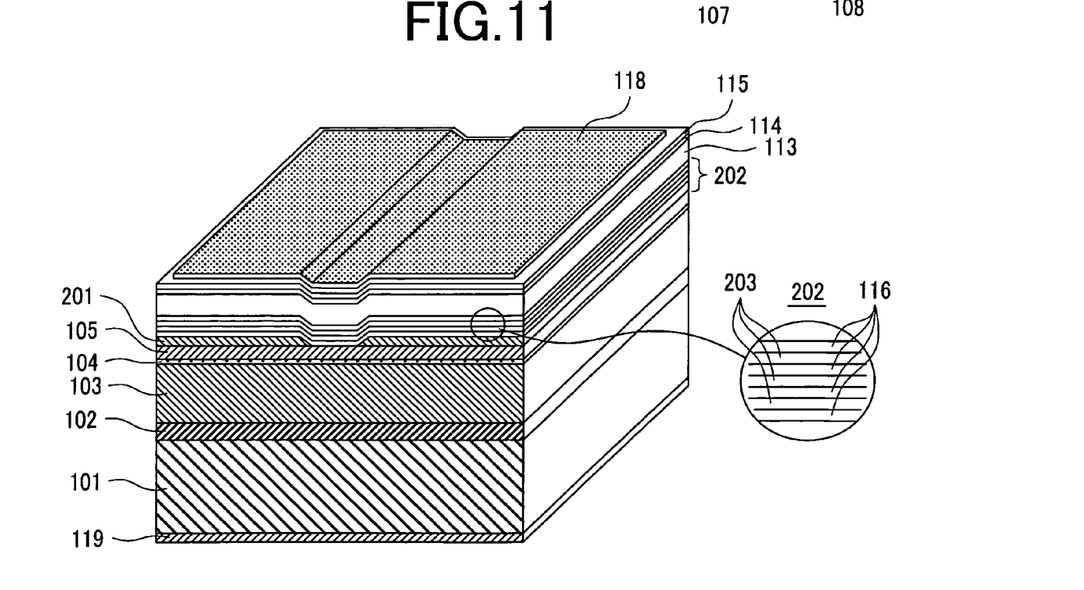
FIG. 11 is a perspective view showing the structure of a completed semiconductor laser chip of Embodiment 2.

In FIG. 10 and FIG. 11, reference numeral 101 denotes a n-GaN substrate, and the plane orientation of the n-GaN substrate 101 is (1-100) plane. Above the substrate 101, an n-GaN buffer layer 102, an n-Al$_{0.08}$Ga$_{0.92}$N cladding layer 103 (Si doped, n=1×10$^{18}$ cm$^{-3}$, 1.2 μm), a GaInN/GaN multi-quantum well active layer 104, a p-GaN/AlGaN super lattice layer 105 (Mg-doped, p=7×10$^{17}$ cm$^{-3}$, 0.15 μm), and an n-Al$_{0.16}$Ga$_{0.8}$In$_{0.04}$N current blocking layer 201 (Si doped, p=1×10$^{19}$ cm$^{-3}$, 0.2 μm) are subjected to successive crystal growth using a metal organic chemical vapor deposition method. The GaInN/GaN multi-quantum well active layer 104 comprises, as shown in an enlarged scale on the right of the drawing, 4 layers of Ga$_{0.5}$In$_{0.5}$N well layers 107 (7 nm thickness) and 5 layers of GaN barrier layers 108 (4 nm thickness) sandwiching each of the layers described above. Further, the P-GaN/AlGaN super lattice structure 105 has a structure in which Mg-doped $Al_{0.16}Ga_{0.84}N$ layers 109 (3 nm) and Mg-doped GaN layers 110 (3 nm) are alternately laminated, as shown in the enlarged scale on the right of the drawing.

On the n-$Al_{0.16}Ga_{0.84}N$ current blocking layer 201, a silicon oxide film is formed and a stripe-like groove is formed by using photolithography. Using the silicon oxide film as a mask, portions of the n-$Al_{0.16}Ga_{0.84}N$ current blocking layer 201 and the p-GaN/AlGaN super lattice layer 105 are removed by a reactive ion etching technique.

Then, crystal growth is again applied to the wafer by metal organic chemical vapor deposition. A modified doped AlGaN/GaN super lattice lateral conduction layer 202, a p-$Al_{0.08}Ga_{0.92}N$ second cladding layer 113, a GaN cap layer 114, and a GaInN super lattice contact layer 115 are subjected to successive crystal growth. The modified doped AlGaN/GaN super lattice lateral conduction layer 202 has a structure in which Mg-doped $Al_{0.16}Ga_{0.84}N$ layers 116 (3.5 nm) and undoped GaN layers 203 (3.5 nm) are alternately laminated, as shown in an enlarged scale on the right of the drawing.

A TiAu layer 118 is evaporated as a p-electrode on the wafer surface of this structure. On the other hand, an NiAlAu layer 119 is vapor deposited to the rear side of the GaN substrate 101 as an n-electrode. Then, it is cleaved to a resonator length of 600 μm into a laser chip.

The thus manufactured semiconductor laser device performs laser oscillation at a threshold current of about 40 mA and the serial resistance is about 5Ω. The slope efficiency of the optical power of the device is about 1.2 mW/mA, and the device has a driving current of about 330 mA at 400 mW of the optical power. Since the current/voltage characteristics of the device show that a current linearly increases in the vicinity of 3 V, the operation voltage in this case is 4.66 V and the device can be driven by a conventional power source at 5 V with a margin.

Embodiment 3

In the super lattice lateral conduction layer of the invention, while the lateral conductivity is increased, the vertical conductivity is improved only by about several tens % compared with the alloys of a uniform composition. Particularly, a super lattice of a large period can greatly improve the lateral conductivity, resulting in a problem of remarkably lowering the vertical conductivity. In Embodiment 3, a countermeasure for the problem was considered. The constitution of the semiconductor laser device in Embodiment 3 is to be described with reference to FIG. 12.

Embodiment 3 shows a structure having a grating formed in the direction of a laser resonator on the crystal surface before growing of the p type re-growth cladding layer 113 by an electron beam exposure technique. The structure of a semiconductor laser chip of Embodiment 3 is to be described based on the manufacturing steps with reference to FIG. 12 and FIG. 13.

Figure 12:
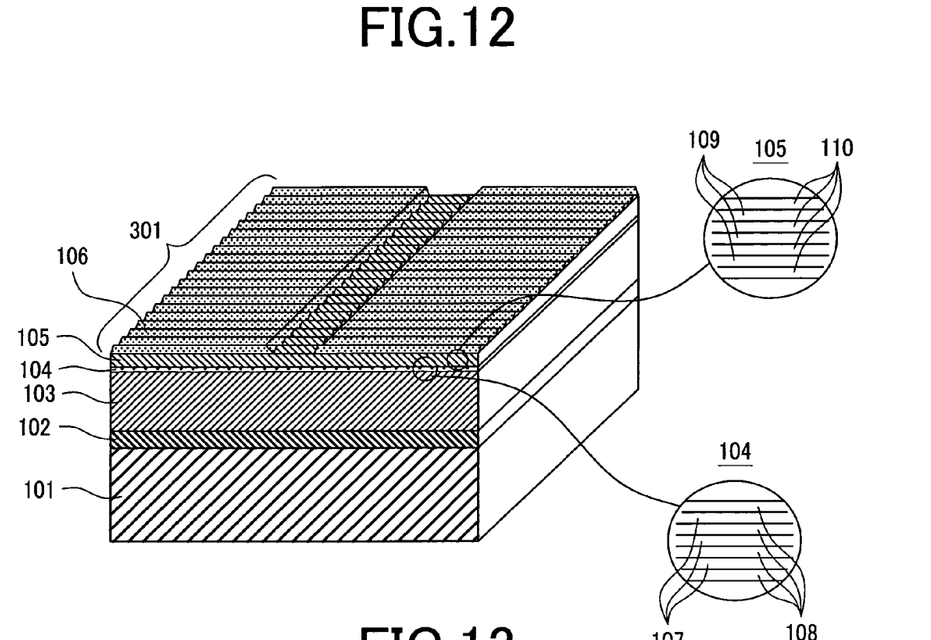
FIG. 12 is a perspective view showing the structure after growing a current blocking layer in a semiconductor laser chip of Embodiment 3.

In Embodiment 3, crystal growth from the GaN substrate 101 to the n-$Al_{0.16}Ga_{0.84}N$ current blocking layer 106 (Si doped, $p=1\times10^{19}$ $cm^{-3}$, 0.1 μm) and the formation of the stripe-like groove are conducted in the same manner as in Embodiment 1. A grating 301 with a period of about 70 nm (40 nm depth) is formed to the wafer by using an electron beam exposure technique and reactive etching technique to form a structure as shown in FIG. 12.

Then, crystal growth is again applied to the wafer by metal organic chemical vapor deposition. An AlGaN/GaN long period super lattice lateral conduction layer 302 (Mg-doped, $p=10^{18}$ $cm^{-3}$, 0.2 μm), a p-$Al_{0.08}Ga_{0.92}N$ second cladding layer 113 (Mg-doped, $p=2\times10^{17}$ $cm^{-3}$, 0.5 μm), a GaN cap layer 114 (Mg-doped, $p=3\times10^{17}$ $cm^{-3}$, 0.1 μm), and a GaInN super lattice contact-layer 115 (Mg-doped, $p=2\times10^{19}$ $cm^{-3}$, 5 nm) are subjected to successive crystal growth to form a structure shown in FIG. 13. The AlGaN/GaN long period superlattice lateral conduction layer 302 comprises a structure in which Mg-doped $Al_{0.16}Ga_{0.84}N$ layers 116 (7 nm) and Mg-doped GaN layers 117 (7 nm) are alternately laminated, as shown in an enlarged scale on the right of the drawing.

Figure 13:
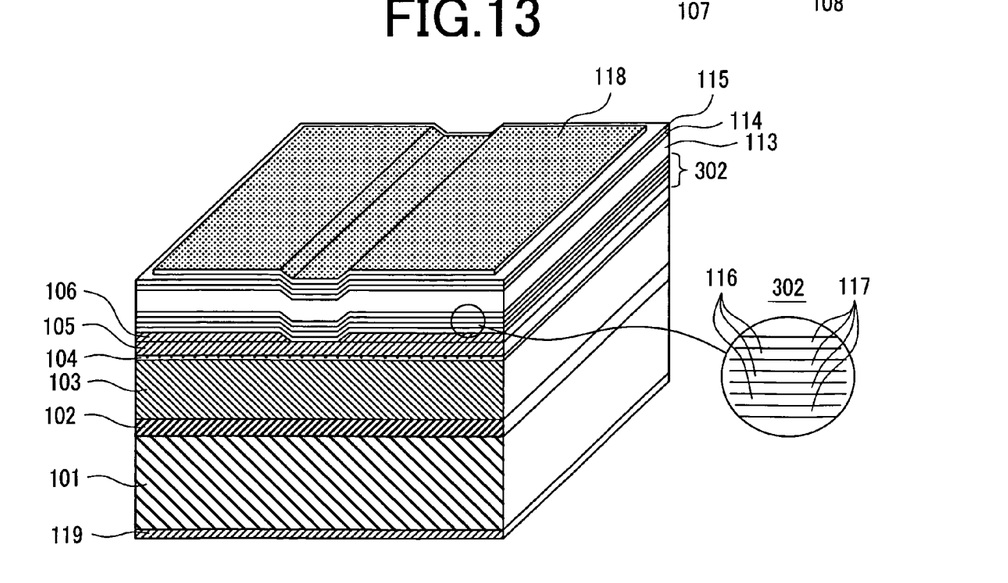
FIG. 13 is a perspective view showing the structure of a completed laser chip of Embodiment 3.

A TiAu layer 118 is evaporated as a p-electrode on the wafer surface of this structure. On the other hand, an NiAlAu layer 119 is evaporated to the rear side of the GaN substrate 101 as an n-electrode. Then, it is cleaved to a resonator length of 600 μm into a laser chip as shown in FIG. 13.

As shown in FIG. 3, in the superlattice layer of 14 nm period, the lateral electrical conductivity is ten times as high as the AlGaN alloy of the uniform composition, which is extremely high. The vertical electrical conductivity, however, is 10% or less of the AlGaN alloy of the uniform composition, which results in increase in the device resistance. However, as a result of forming the AlGaN/GaN long period super lattice lateral conduction layer 302 on the grating 301 formed, the thickness of the superlattice structure is reduced on the lateral surface of the grating and the current flows through the portion to obtain a sufficient vertical electrical conductivity even in the super lattice of long period.

The thus manufactured semiconductor device performs laser oscillation at a threshold current of about 40 mA and the serial resistance is about 4Ω. The device has a slope efficiency of about 1.2 mW/A for the optical power and about 80 mA of driving current at 100 mW of the optical power. Since the current/voltage characteristics of the device show that a current linearly increases in the vicinity of 3 V, the operation voltage in this case is 3.3 V and the device can be mounted on a portable recording device. Further, this structure makes it possible to form a distributed feedback resonator using the dispersive reflection by the grating. Thus, this structure makes it possible to obtain an advantage that formation of an end face with cleaving is not necessary, which has prevented integration or the like in conventional short wavelength semiconductor lasers.

Embodiment 4

In the embodiment described above, since the AlGaN alloy is used as the cladding layer 103, the lattice constant is not matched completely to the GaN substrate 101 and the entire thickness of the cladding layer 103 has to be restricted to about 1 to 1.5 μm in order to satisfy the critical distortion conditions. However, since the extension of the distribution of the laser light in the vertical direction is demanded in view of the necessity of increasing the power of the semiconductor laser device and decreasing the longitudinal/lateral ratio of the beam shape of the semiconductor laser device, restriction for the thickness of the growth film hinders the attainment of such demand. A countermeasure for such a problem is considered in Embodiment 4. The structure of the semiconductor laser device of Embodiment 4 is to be described based on the manufacturing steps with reference to FIG. 14 and FIG. 15.

Figure 14:
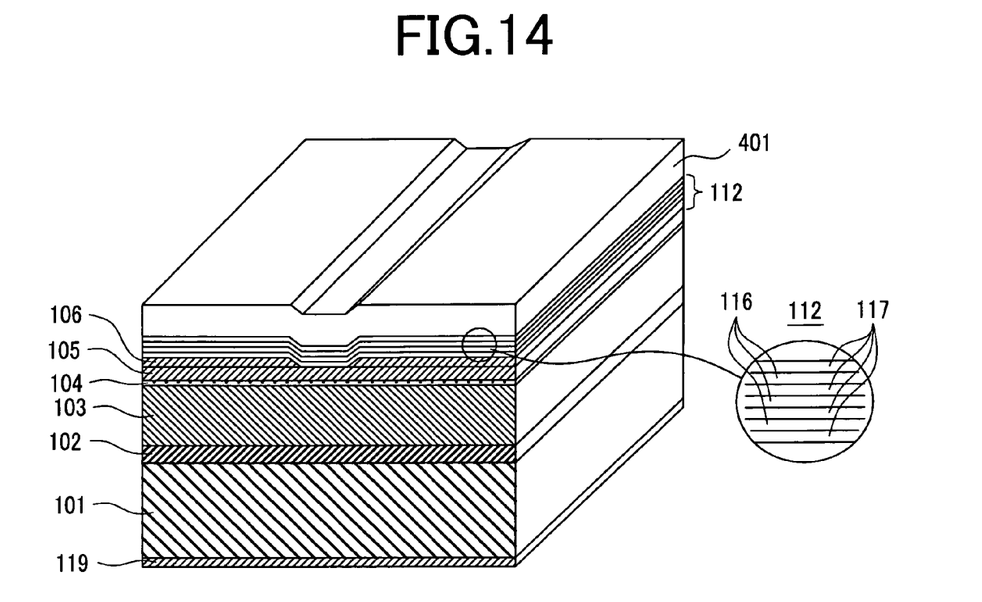
FIG. 14 is a perspective view showing a structure upon completion of a multi-layered crystal growth in a laser chip of Embodiment 4.

Embodiment 4 proposes a structure of using AlGaInN. In AlGaInN, it is more difficult to perform p-doping for the crystal film of the AlGaN type semiconductor laser device by utilizing the characteristics of the AlGaN/GaN super lattice lateral conduction layer. Also, in Embodiment 4, crystal growth from the GaN substrate 101 to the n-$Al_{0.16}Ga_{0.84}N$ current blocking layer 106 and the formation of the stripe-like groove are conducted in the same manner as in Embodiment 1.

Then, crystal growth is again applied to the wafer by metal organic chemical vapor deposition. An AlGaN/GaN super lattice lateral conduction layer 112 (Mg-doped, p=$10^{18}$ cm$^{-3}$, 0.2 μm), and an undoped $Al_{0.16}Ga_{0.8}In_{0.04}N$ optical waveguide layer 401 (n=$1\times10^{17}$ cm$^{-3}$, 1.0 μm) are subjected to successive crystal growth to form a structure shown in FIG. 14. The AlGaN/GaN super lattice lateral conduction layer 116 comprises a structure in which Mg-doped $Al_{0.16}Ga_{0.84}N$ layers 116 (3.5 nm) and Mg-doped GaN layers 117 (3.5 nm) are alternately laminated, as shown in an enlarged scale on the right of the drawing.

Then, the undoped $Al_{0.16}Ga_{0.8}In_{0.04}N$ optical waveguide layer 401 is removed by a reactive ion etching while leaving an absorption reduction region 402 (2.4 μm width) which is a portion covering the stripe-like groove of the current blocking layer 106 (corresponding to groove 111 shown in FIG. 8). Since the absorption reduction region 402 is formed of undoped $Al_{0.16}Ga_{0.8}In_{0.04}N$, there is no optical loss due to absorption of free carriers and no increase in losses of resonator of the device even in the case where a large amount of light energy is distributed in the region.

In addition, mismatches of the lattice constants of AlGaInN and GaN are smaller than those of AlGaN and GaN, AlGaInN and AlGaN having a similar forbidden band width to each other. Thus, the structure can increase the critical thickness of the entire crystal growth layer and increase the optical volume necessary for increasing the power.

Figure 15:
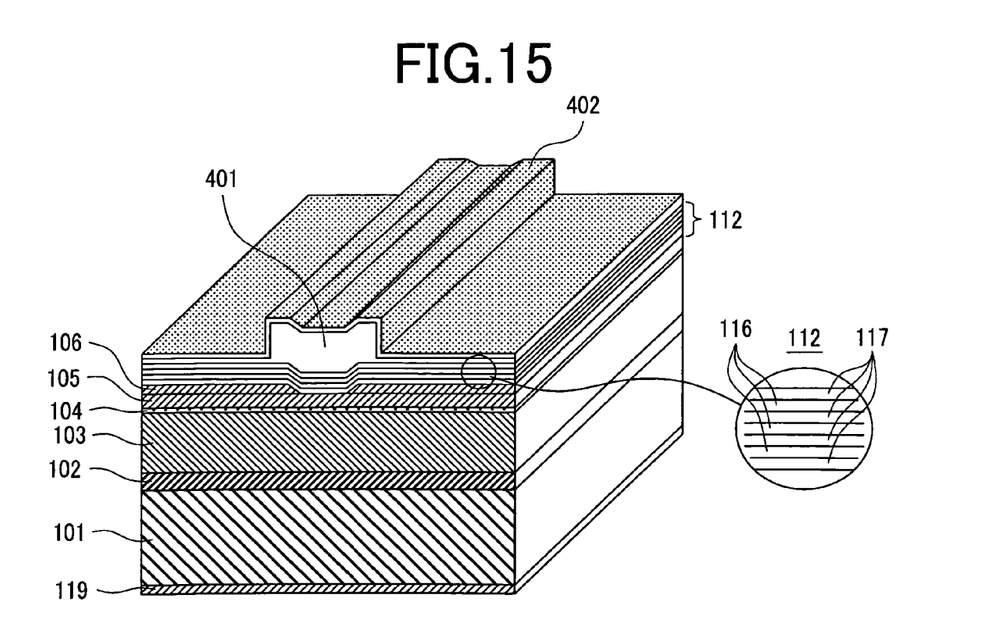
FIG. 15 is a perspective view showing the structure of a completed laser chip of Embodiment 4.

A TiAu layer 118 is evaporated as a p-electrode on the wafer surface of this structure. On the other hand, an NiAlAu layer 119 is evaporated to the rear side of the GaN substrate 101 as an n-electrode. Then, it is cleaved to a resonator length of 600 μm into a laser chip as shown in FIG. 15.

The thus manufactured semiconductor device performs laser oscillation at a threshold current of about 40 mA and the serial resistance is about 6Ω. The device has a slope efficiency of about 1.2 mW/mA for the optical power and about 290 mA of driving current at 500 mW of the optical power. Since the current/voltage characteristics of the device show that a current linearly increases in the vicinity of 3 V, the operation voltage in this case is 4.74 V and the device can be driven by usual power source at 5 V with margin. Further, the operation voltage in the case of using this semiconductor laser device at a power of about 100 mW is about 3.6 V, and it can be mounted also on a portable recording device driven by three dry cell batteries.

Embodiment 5

Figure 16:
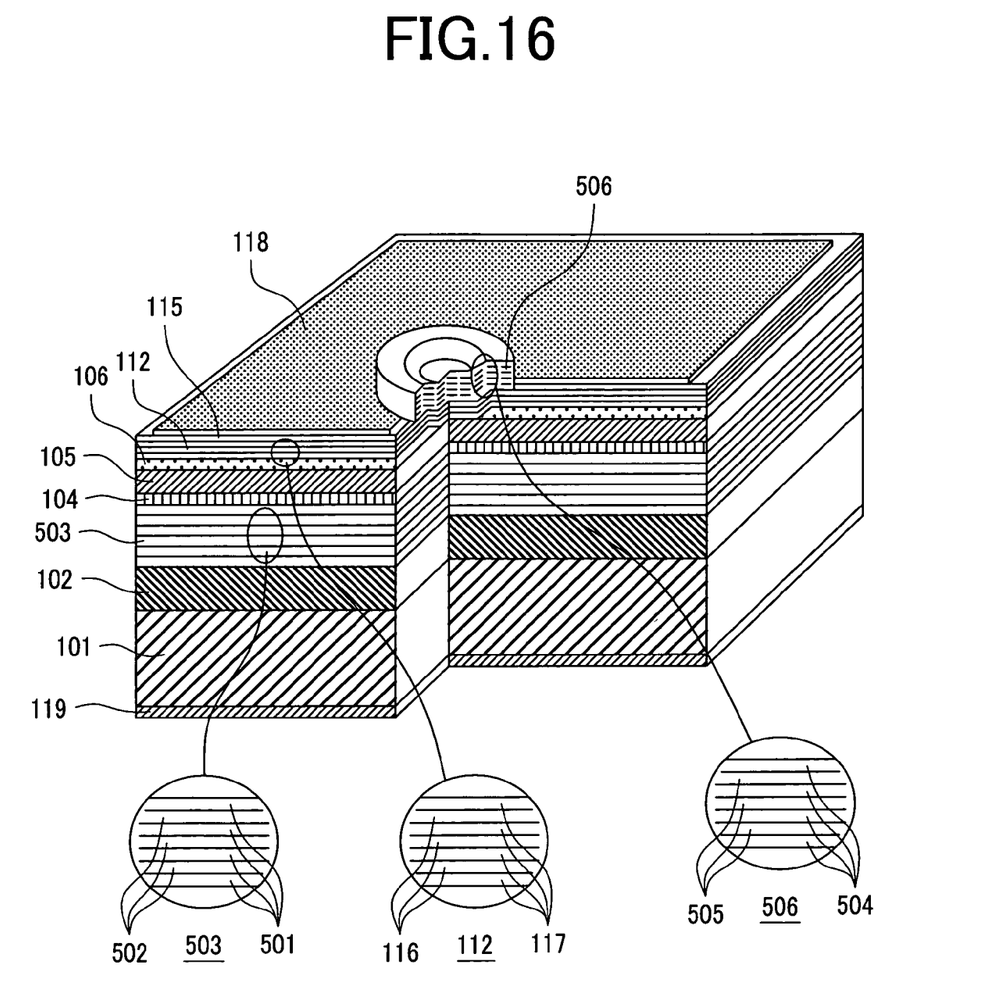
FIG. 16 is a partially cross sectioned perspective view of a completed structure of a laser chip of Embodiment 5.

FIG. 16 shows an example of applying a super lattice lateral conduction layer to a surface emitting type semiconductor laser device as Embodiment 5.

In FIG. 16, reference numeral 101 denotes a n-GaN substrate, and the plane orientation of the n-GaN substrate 101 is (1-100) plane. Above the n-GaN substrate 101, an n-GaN buffer layer 102 (0.2 μm), an lower distributed reflection film 503, a GaInN/GaN multi-quantum well active layer 104, a p-GaN/AlGaN super lattice layer 105 (Mg-doped, p=$7\times10^{17}$ cm$^{-3}$, 0.1 μm), and an n-$Al_{0.16}Ga_{0.84}N$ current blocking layer 106 (Si doped, p=$1\times10^{19}$ cm$^{-3}$, 0.2 μm) of about 0.1 μm thickness are subjected to successive crystal growth by a metal organic chemical vapor deposition method to form a structure shown in FIG. 16. The distributed reflection film 503 has a structure in which n-GaN layers 501 (Si doped n=$1\times10^{18}$ cm$^{-3}$, 36 nm) and n-$Al_{0.16}Ga_{0.8}In_{0.04}N$ layers 502 (Si doped n=$1\times10^{18}$ cm$^{-3}$, 33.7 nm) are alternately laminated 30 times, as shown in an enlarged scale on the lower left of the drawing. The GaInN/GaN multi-quantum well active layers 104 comprises four layers of $Ga_{0.5}In_{0.5}N$ well layers 107 (7 nm thickness) and five layers of GaN barrier layers 108 (4 nm thickness) sandwiching each of the layers described above.

A silicon oxide film is formed on the n-$Al_{0.16}Ga_{0.84}N$ current blocking layer 106, and holes used as light emission regions are formed by using photolithography. Using the silicon oxide film as a mask, a portion of the n-$Al_{0.16}Ga_{0.84}N$ current blocking layer 106 and the p-GaN/AlGaN super lattice layer 105 is removed by reactive ion etching.

Then, crystal growth is again applied to the wafer by a metal organic chemical vapor deposition method. An AlGaN/GaN super lattice lateral conduction layer 112 (Mg-doped, p=$10^{18}$ cm$^{-3}$, 0.2 μm) and a GaN cap layer 115 (Mg-doped, p=$3\times10^{17}$ cm$^{-3}$, 0.1 μm) are subjected to successive crystal growth. The AlGaN/GaN super lattice lateral conduction layer 112 has a structure in which Mg-doped $Al_{0.16}Ga_{0.84}N$ layers 116 (3.5 nm) and Mg-doped GaN layers 117 (3.5 nm) are alternately laminated, as shown in an enlarged scale on the right of the drawing.

Then, an upper distributed Bragg reflector film 506 of about 3 μm diameter is formed above the conduction holes of the wafer (removed portion in the current blocking layer 106) by using the lift off technique using the photoresist as a mask. The upper distributed Bragg reflector film 506 has a structure of stacking a silicon oxide film 504 (70.8 nm) and titanium oxide 505 (36.2 nm) as shown in an enlarged scale on the lower right of the drawing.

A TiAu layer 118 is evaporated as a p-electrode on the GaN layer 117 (Mg-doped, p=$3\times10^{17}$ cm$^{-3}$, 0.1 μm) other than a portion of the wafer surface of the structure provided with the upper distributed reflection film 506. On the other hand, an NiAlAu layer 119 is deposited as an n-electrode to the rear side of the GaN substrate 101 to form a semiconductor laser device as shown in FIG. 16.

The thus manufactured semiconductor laser device performs laser oscillation at a threshold current of about 0.5 mA and has a serial resistance of about 15Ω.

Description of reference numerals used in the drawings which are attached to the specification is as follows:

1 . . . uniform composition cladding layer
2 . . . superlattice lateral conduction layer
3 . . . groove-like current conduction region
4 . . . current blocking layer
5 . . . calculation region
6 . . . semiconductor substrate
7 . . . n-cladding layer
8 . . . active layer
9 . . . p-cladding layer
12 . . . current distribution
101 . . . n-GaN substrate
102 . . . n-GaN buffer layer
103 . . . n-$Al_{0.08}Ga_{0.92}N$ cladding layer
104 . . . GaInN/GaN multi-quantum well active layer
105 . . . p-GaN/AlGaN superlattice layer
106 . . . n-$Al_{0.16}Ga_{0.84}N$ current blocking layer
107 . . . $Ga_{0.8}In_{0.2}N$ well layer
108 . . . GaN barrier layer
109 . . . $Al_{0.16}Ga_{0.84}N$,
110 . . . GaN
111 . . . stripe-shaped groove
112 . . . AlGaN/GaN superlattice lateral conduction layer
113 . . . p-$Al_{0.08}Ga_{0.92}N$ second cladding layer 114 ... GaN cap layer
115 ... GaInN superlattice contact layer
116 ... $Al_{0.16}Ga_{0.84}N$ layer
117 ... GaN layer
118 ... TiAu layer
119 ... NiAlAu layer
201 ... $n-Al_{0.16}Ga_{0.8}In_{0.04}N$ current blocking layer
202 ... modified doped AlGaN/GaN superlattice lateral conduction layer
203 ... undoped GaN layer
301 ... grating
302 ... AlGaN/GaN long period superlattice lateral conduction layer
401 ... undoped $Al_{0.16}Ga_{0.8}In_{0.04}N$ optical waveguide layer
402 ... absorption reduction region
501 ... n-GaN
502 ... $n-Al_{0.16}Ga_{0.8}In_{0.04}N$
503 ... lower distributed reflection film
504 ... silicon oxide film
505 ... titanium oxide
506 ... upper distributed reflection film

What is claimed is:

1. A semiconductor laser device comprising:
   at least cladding layers comprised of semiconductor crystals of n and p conduction types and an active layer disposed between the cladding layers and comprised of semiconductor crystals with a forbidden band width narrower than a forbidden band width of the cladding layers, the cladding layers and the active layer being formed above a single crystal substrate of n conduction type;
   a current blocking layer provided with a groove-like current conduction region on the cladding layer of the p conduction type and comprised of a n conduction type or semi-insulating semiconductor layer, the cladding layer of the p conduction type being positioned on a side of the active layer opposite to the single crystal substrate, with the active layer being used as a reference position so that said active layer is formed between the current blocking layer and the substrate; and
   a structure for burying the current blocking layer with a re-growth cladding layer comprised of the p conduction type semiconductor so that current blocking layer is formed between a portion of the re-growth cladding layer and the active layer;
   a first electrode being positioned on the single crystal substrate opposite to a side of the cladding layer of the n conduction type; and
   a second electrode being positioned on the side of the re-growth cladding layer comprised of the p conduction type semiconductor;
   wherein a portion of the re-growth cladding layer is a super lattice cladding layer in which a semiconductor layer with a wide forbidden band width and a semiconductor layer with a narrow forbidden band width are alternately laminated at a period of 4 nm or more and 10 nm or less.

2. The semiconductor laser device according to claim 1, wherein the super lattice cladding layer formed in the re-growth cladding layer for burying the current blocking layer is impurity-doped only for the layer with the wide forbidden band width.

3. The semiconductor laser device according to claim 1, wherein the cladding layer of a single composition is impurity-doped only for the layer with a wide forbidden band width.

4. A semiconductor laser device comprising:
   at least cladding layers comprised of semiconductor crystals of n and p conduction types and an active layer disposed between the cladding layers and comprised of semiconductor crystals with the same forbidden band width as that of the cladding layers, the cladding layers and the active layer formed above a single crystal substrate of n conduction type;
   a current blocking layer provided with a groove-like current conduction region on the cladding layer of the p conduction type and made of a n conduction type or semi-insulating semiconductor layer, the cladding layer of the p conduction type being positioned on a side of the active layer opposite to the single crystal substrate, with the active layer used as a reference position so that said active layer is formed between the current blocking layer and the substrate;
   a structure for burying the current blocking layer with a re-growth cladding layer comprised of the p conduction type semiconductor so that current blocking layer is formed between a portion of the re-growth cladding layer and the active layer;
   a first electrode being positioned on the single crystal substrate opposite to a side of the cladding layer of the n conduction type; and
   a second electrode being positioned on the side of the re-growth cladding layer comprised of the p conduction type semiconductor;
   wherein:
   a portion of the re-growth cladding layer is a super lattice cladding layer in which a semiconductor layer with a wide forbidden band width and a semiconductor layer with a narrow forbidden band width are alternately laminated at a period of 4 nm or more and 10 nm or less; and
   the re-growth cladding layer is removed with a portion corresponding to the groove-like current conduction region left.

5. The semiconductor laser device according to claim 4, wherein electrodes are disposed directly to the outer surface of the re-growth cladding layer corresponding to the groove-like current conduction layer and to the outer surface of the super lattice cladding layer exposed by removing the re-growth cladding layer.

6. A semiconductor laser device comprising:
   at least a cladding layer comprised of a n conduction type semiconductor crystal, a lower distributed reflection film made of a n conduction type super-lattice layer, and an active layer comprised of a semiconductor crystal with a forbidden band width narrower than that of the n conduction type super-lattice layer, each formed above a single crystal substrate of n conduction type;
   a p conduction type super-lattice layer, a current blocking layer comprised of a n conduction type or semi-insulating semiconductor layer in which a hole-like current conduction region is disposed as a light emitting region, a super-lattice cladding layer for burying the current blocking layer, the super-lattice cladding layer having a structure in which semiconductor layers of a wide forbidden band width and semiconductor layers of a narrow forbidden band width are alternately laminated at a period of 4 nm or more and 10 nm or less, and an upper distributed reflection film disposed in a region of the super-lattice cladding layer corresponding to the hole-like current conduction region;
   a first electrode being positioned on the single crystal substrate opposite to a side of the cladding layer of the n conduction type; and
   a second electrode being positioned on the side of the super-lattice cladding layer comprised of the p conduction type semiconductor;

wherein the p conduction type super-lattice layer, the current blocking layer, the super-lattice cladding layer, and the upper distributed reflection film are disposed on a side of the active layer opposite to the single crystal substrate with the active layer used as a reference point so that said active layer is formed between the current blocking layer and the substrate and so that the current blocking layer is formed between the active layer and a portion of the super-lattice cladding layer for burying the current blocking layer.

7. The semiconductor laser device according to claim 6, wherein an electrode is disposed directly to the outer surface of the super-lattice cladding layer other than the region corresponding to the hole-like current conduction region, the super-lattice cladding layer having a structure in which semiconductor layers of a wide forbidden band width and semiconductor layers of a narrow forbidden band width are alternately laminated at a period of 4 nm or more and 10 nm or less.

8. A semiconductor laser device according to claim 1, further comprising a first electrode formed on a side of the super lattice cladding layer opposite to the current block layer so that said super lattice cladding layer is formed between the first electrode and the current blocking layer, wherein the alternate lamination of the semiconductor layer with the wide forbidden bandwidth and the semiconductor layer with the narrow forbidden bandwidth at a period of 4 nm or more and 10 nm or less is configured to provide a wide range of lateral conduction in the super lattice cladding layer to decrease resistance to current flow between the first electrode and the current blocking layer.

9. A semiconductor laser device according to claim 4, further comprising a first electrode formed on a side of the super lattice cladding layer opposite to the current block layer so that said super lattice cladding layer is formed between the first electrode and the current blocking layer, wherein the alternate lamination of the semiconductor layer with the wide forbidden bandwidth and the semiconductor layer with the narrow forbidden bandwidth at a period of 4 nm or more and 10 nm or less is configured to provide a wide range of lateral conduction in the super lattice cladding layer to decrease resistance to current flow between the first electrode and the current blocking layer.

10. A semiconductor laser device according to claim 6, further comprising a first electrode formed on a side of the super lattice cladding layer opposite to the current block layer so that said super lattice cladding layer is formed between the first electrode and the current blocking layer, wherein the alternate lamination of the semiconductor layer with the wide forbidden bandwidth and the semiconductor layer with the narrow forbidden bandwidth at a period of 4 nm or more and 10 nm or less is configured to provide a wide range of lateral conduction in the super lattice cladding layer to decrease resistance to current flow between the first electrode and the current blocking layer.

* * * * *